United States Patent [19]
Frye et al.

[11] Patent Number: 5,481,205
[45] Date of Patent: Jan. 2, 1996

[54] TEMPORARY CONNECTIONS FOR FAST ELECTRICAL ACCESS TO ELECTRONIC DEVICES

[75] Inventors: Robert C. Frye, Piscataway; Maureen Y. Lau, Keyport; King L. Tai, Berkeley Heights, all of N.J.

[73] Assignee: AT&T Corp., Murray Hill, N.J.

[21] Appl. No.: 344,393

[22] Filed: Nov. 23, 1994

Related U.S. Application Data

[63] Continuation of Ser. No. 906,072, Jun. 29, 1992, abandoned.

[51] Int. Cl.⁶ .............................. G01R 1/06; H01L 23/48
[52] U.S. Cl. ........................................... 324/757; 257/739
[58] Field of Search ...................... 324/757, 754, 324/761, 725; 257/739

[56] References Cited

U.S. PATENT DOCUMENTS

| | | | |
|---|---|---|---|
| 4,571,540 | 2/1986 | Stowers et al. | 324/158 P |
| 4,585,991 | 4/1986 | Reid et al. | 324/158 P |
| 4,937,653 | 6/1990 | Blonder et al. | 257/739 |
| 4,987,364 | 1/1991 | Watts | 324/158 P |
| 5,010,249 | 4/1991 | Nishikawa | 324/158 P |
| 5,072,116 | 12/1991 | Kawade et al. | 324/158 P |
| 5,103,557 | 4/1992 | Leedy | 324/158 P |
| 5,177,439 | 1/1993 | Liu et al. | 324/158 P |

*Primary Examiner*—Ernest F. Karlsen
*Attorney, Agent, or Firm*—David I. Caplan

[57] ABSTRACT

A given testing substrate for fast-testing many integrated-circuit electronic devices, one after the other, has a set of mutually insulated collated wiring areas that can be aligned with solder-bump I/O pads of the electronic devices. At the surface of each of the corrugated areas is located a layer that is an electrically conductive durable oxide, or that is itself durable, electrically conductive, and non-oxidizable. During testing, the solder-bump I/O pads of the electronic device being tested are aligned with and pressed against the corrugated wiring areas of the given substrate. Alternatively, the electronic devices being of the electrically programmable variety, such as EPROMs, programming voltages can be delivered to each of the devices, one after the other, through the corrugated wiring areas of a single substrate.

28 Claims, 1 Drawing Sheet

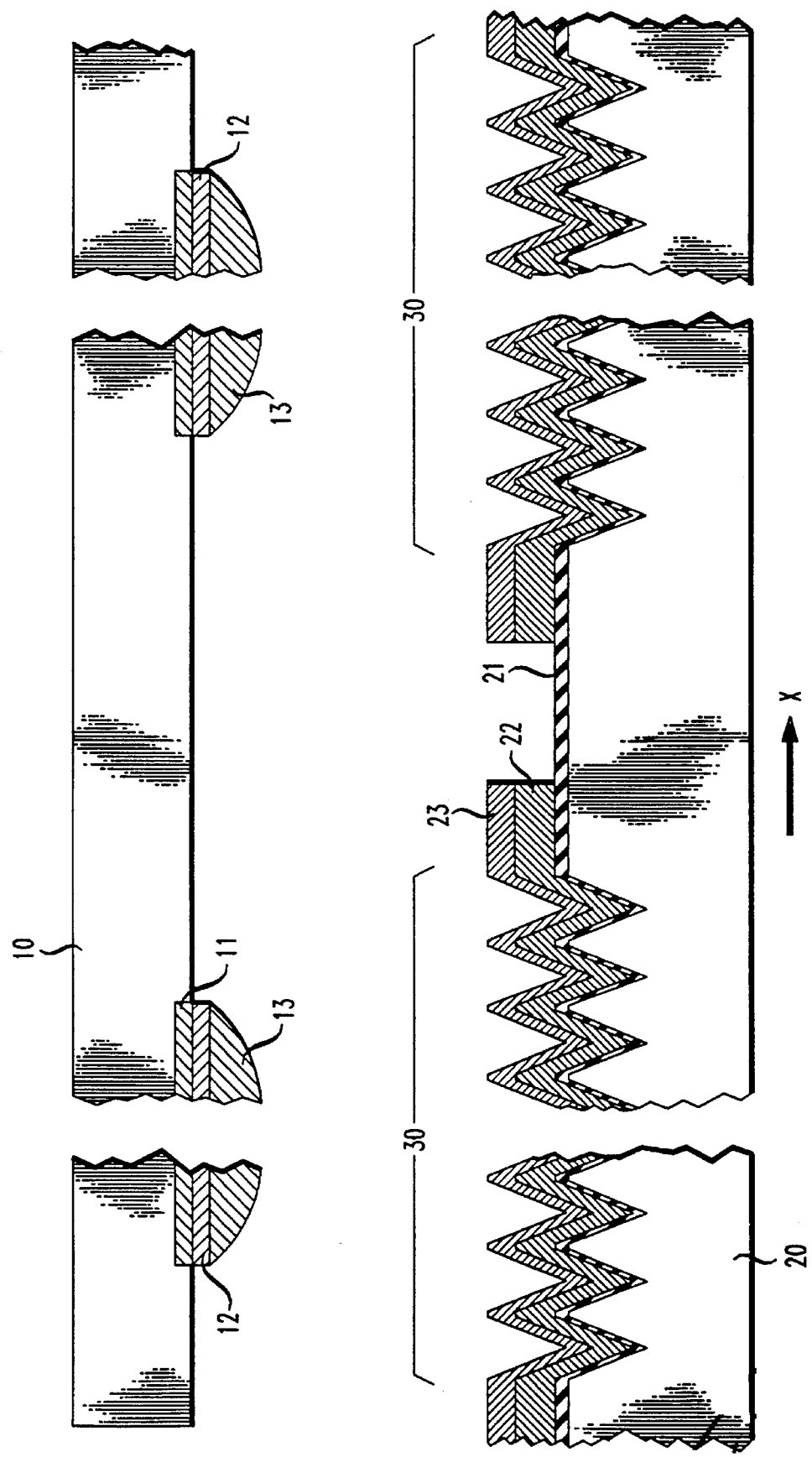

1

TEMPORARY CONNECTIONS FOR FAST ELECTRICAL ACCESS TO ELECTRONIC DEVICES

This application is a continuation of application Ser. No. 07/906,072, filed on Jun. 29, 1992, now abandoned.

TECHNICAL FIELD

This invention relates to methods of temporarily electrically connecting together a plurality of input-output (I/O) pads or terminals of an electronic device to that of another device, and more particularly to methods of thus connecting together such I/O pads for the purpose of relatively fast electrical testing of electronic devices, such as semiconductor integrated circuit chips—the term "fast testing" referring to testing of the order of typically one second of time duration—or for the purpose of programming electrically programmable electronic devices, such as electrically programmable read only memories (EPROMs).

BACKGROUND OF THE INVENTION

Prior to bonding an electronic device, such as a semiconductor integrated circuit chip, into its final position in a package, for example, in a multichip module (comprising several chips), it is often desirable for economic reasons to test the chip electrically and discard it in case the test indicates that the chip suffers from an undesirable defect. In this way, further time and materials are not wasted in conjunction with processing and handling defective chips, such as packaging them.

In one approach of prior art, such testing is performed by testing each semiconductor integrated circuit chip at the semiconductor wafer level—that is, by testing all the integrated circuit chips before they have been diced from the wafer into stand-alone individual chips. Each chip has input-output terminals or pads ("chip I/O pads") located on a major surface of the chip. Typically, these I/O pads are metallic and have surfaces, typically approximately 0.10 mm×0.10 mm, typically comprising aluminum. The pads are typically spaced apart by approximately 0.10 min. Each of the I/O pads can be devoted to receiving input signals or delivering output signals (or devoted to both), or devoted to receiving power or ground.

In order to test a specific chip at the wafer level, the wafer and a testing circuit board are aligned, as by means of a step-and-repeat procedure. The testing circuit board has a set of probe wires, each typically made of tungsten or of beryllium copper. During testing, the probe wires are brought into good electrical contact with some or all of the chip I/O pads, including power and ground pads. Signals from probe circuitry are delivered through some of the probe wires to some of the chip I/O pads, while power and ground (voltages) are delivered to the chip power and ground pads. The resulting signal output voltages that are developed at other of the chip I/O pads are then detected by the probe circuitry via other of the probe wires. The time duration of each test for each chip is typically of the order of only a second ("fast testing"). The circuit board together with the probe circuitry are thereafter reused for testing other chips on the same wafer, as well as for other chips on other wafers.

A problem with the foregoing fast testing procedure is that the testing signal frequency is limited to undesirably low values owing to the inductance of the probe wires and the capacitance of the testing circuit board. Therefore, high signal frequency testing—i.e., testing with signal frequencies as high as those to be handled by the packaged chip during subsequent normal operation, typically about 50 to 100 MHz or more—is not feasible at the wafer level but must await not only dicing of the wafer into chips but also proper packaging of the chips—that is, assembling each chip in a package. Each such package has a fan-out of the chip I/O pads into I/O pins that have surfaces of approximately 0.4 mm×0.4 mm and that are spaced apart by approximately 2.5 mm. In this way, each thus packaged chip can be tested by plugging the package's I/O pins into a testing circuit receptacle that has electrical contacts which are aligned with the packaged chip pins, these contacts having wires connected to testing circuitry. However, such testing is costly in that it thus requires prior packaging of each chip: if a chip is fatally defective and thus is to be discarded, the packaging expenditure was wasted on such a chip. Therefore, it would be desirable to have a method of high signal frequency, fast testing of integrated circuit chips (or other electrical devices for that matter, such as laser chips) before they are packaged.

SUMMARY OF THE INVENTION

This invention provides a method of electrically testing an electronic device, such as a semiconductor integrated circuit chip, having a first set of first metallic I/O terminals or pads, comprising the steps of (a) providing a wiring substrate having a set of wiring layers respectively connected to a second set of second metallic I/O terminals or pads, an exposed surface of each of the second pads comprising a layer of substance having a corrugated exposed surface, the substance comprising either a metal whose oxide is electrically conducting or a non-oxidizable electrically conducting material.

(b) pressing at least a first subset of the first set of pads into electrical contact with at least a first subset of the second set of pads;

(c) applying voltages to at least some of the first subset of the first set of pads through at least some of the first subset of the second set of pads;

(d) measuring the electrical responses thereto that are developed at other of the first subset of the first set of pads through other of the first subset of the second set of pads; and (e) pulling apart the first subset of the first set of pads from the first subset of the second set of pads.

The substance advantageously is durable and can be, for example, phosphorus-containing nickel, ruthenium, titanium nitride, or a noble metal such as platinum or gold. If a metal such as gold is used, the I/O pads of the electronic device should not be coated with gold or a gold-containing substance, lest the gold in the pads of the electronic device and the gold in the pads of the wiring substrate ("testing substrate") undesirably tend to fuse the respective pads together, during step (b) and/or step (c), and thus interfere with the pulling apart of step (e). Advantageously, in general the pulling apart of step (e) is performed at a time in the approximate range of less than one to ten seconds after completion of the pressing of step (b), typically approximately one or two seconds.

Fast testing of a plurality of electronic devices, one after the other, all having I/O pads that are alignable with the I/O pads of the testing substrate, can thus be performed in accordance with the above-recited steps (a) through (e) using the same testing substrate, and the plurality can be as large as a hundred, or a thousand, or ten thousand, or perhaps one hundred thousand or more. That is, the same testing substrate can be reused for many repetitions of fast electrical testing.

Moreover, the invention further provides a method of electrically programming an electronic device, such as an EPROM (electrically programmable read only memory) having a first set of metallic I/O terminals or pads, comprising the above-recited steps (a), (b), (c), and (e). The wiring substrate can then be reused for electrically programming a plurality of such electronic devices.

BRIEF DESCRIPTION OF THE DRAWING

FIG. 1 shows an elevational view, partly in cross section, of an electronic device and a testing substrate, useful in understanding a specific embodiment of the invention.

Only for the sake of clarity, the drawing is not to scale.

DETAILED DESCRIPTION

Referring to FIG. 1, an integrated-circuit electronic device 10 to be tested via a testing (wiring) substrate 20 has wiring layers 11, typically of aluminum. The electronic device 10 is typically a semiconductor integrated circuit or a laser. The wiring layers 11 are coated with localized foundation ("base") metal layers 12 which in turn are coated with bumps 13, such as solder or gold, at various areas where localized chip I/O terminals (or pads) are located. More specifically, base metal layers 12, each typically of tungsten having a thickness of approximately 0.1 µm, serve as foundation and barrier layers for bumps 13. Titanium layers (not shown), each having a thickness of approximately 0.1 µm, typically intervene between the base metal layers 12 and the wiring layers 11, in order to provide adhesion between the base metal layers 12 and the wiring layers 11, as known in the art. The bumps 13 typically are made of a solder material—such as PbSn, SnAg, SnSb, In, InAg, InSn, InBi, or AuSn. The solder has been heated—after its formation as a preform on the base layers 12, typically by evaporation or sputtering—to form the shape of a solder ball, as indicated in FIG. 1.

The testing substrate 20, typically monocrystalline silicon oriented (100) has wiring layers 22, typically of aluminum having a thickness of approximately 2.5 µm, that are connected to testing circuitry (not shown). The wiring layers 22 are separated from the testing substrate 20 by an insulating layer 21, typically of silicon dioxide having a thickness of approximately 0.5 µm. The wiring layers 22 are coated with a durable layer 23, typically phosphorus-containing nickel having a thickness in the approximate range of 1 to 2 µm.

At areas of the top surface of the testing substrate 20 underlying each bump 13 and hence underlying each chip I/O pad of the device 10, the top surface of the testing substrate 20 has substrate I/O pads formed by localized (in the X-direction) corrugated wiring areas 30—i.e., localized portions of the top surface, each of which portions being corrugated with a set of parallel V-grooves separated by plateau regions located on the top surface of the durable layer 23. Typically, the surface of each V-groove slants at an angle of 54°.7 with respect to the X-direction—i.e.,54°.7 with respect to the original top surface of the (silicon) testing substrate 20, viz., with respect to the (111) planes in a silicon testing substrate. Each V-groove typically has a vertical depth of approximately 10 µm deep in the silicon substrate 20, and hence typically has a horizontal span of approximately 2×10 µm x cotangent (54°.7)=14 µm in the X-direction, and the distances between nearest neighboring vertices of the V-grooves are all typically approximately 16 µm in the X-direction, each of the plateau regions typically having a width of approximately 1 to 2 µm in the X-direction. The overall width in the X-direction of each corrugated wiring area 30 typically is approximately 100 µm, so that there is a total of typically six V-grooves associated with each localized corrugated wiring area 30 and hence with each substrate I/O pad. The overall width in the X-direction of each of these chip I/O pads is somewhat less than that of each of the localized corrugated areas, in order to have a safety margin.

In order to fabricate the testing substrate 20 with its corrugated wiring areas 30, the following procedure can be used. A layer of initial silicon dioxide (not shown) is thermally grown under dry conditions at a temperature of approximately 950° C. on an initially planar (not shown) top surface of the silicon substrate 20, typically to a thickness of approximately 0.2 µm. The top surface is the (100) crystal plane of silicon. Then a layer of photoresist, typically made of materials as manufactured by Shipley, is spun-on over the top (planar) surface of the thermally grown silicon dioxide layer, typically to a thickness of approximately 0.5 µm. Next, the resist layer is patterned, at the future corrugated wiring areas 30, by a standard photolithographic process, whereby there remains at each of these areas a set of parallel stripes of resist each having a width of approximately 2.0 µm, and the distance between nearest approach of adjacent stripes being approximately 9.2 µm—that is, the width of each of the thus exposed stripe shaped areas of the silicon dioxide layer also being approximately 9.2 µm. Next, using the patterned resist as a protective mask against etching, the exposed silicon dioxide is anisotropically (vertically) etched with a standard buffered solution of HF, whereby the silicon dioxide layer becomes patterned into stripes and underlying stripes of silicon of the substrate 20 become exposed. The resist layer is then removed by a standard technique. Next, using the silicon dioxide stripes as an etch mask, the desired V-grooves are etched into the silicon substrate, typically by using an approximately 2 normal solution of KOH at approximately 70° C. Then the silicon dioxide stripes are removed, typically again by means of the buffered solution of HF. Next, the silicon dioxide layer 21 is grown, again typically at about 950° C. by means of a dry process. Then, metallic aluminum is sputter-deposited everywhere on the top surface of the silicon dioxide layer 21, and is patterned to form the wiring layer 22, in accordance with the desired wiring pattern for the testing substrate 20. Finally, the thus patterned wiring layer 22 is everywhere coated with the durable layer 23, for example, by means of electroless plating of phosphorus nickel from a plating solution containing nickel and phosphorus (e.g., hypophosphite) ions. For example, this solution can be "Nicklad-1000" sold by WITCO Company. At any rate, the plating solution advantageously includes stabilizers, buffers, accelerators, complexors, and wetting agents.

In order to perform the desired fast-testing of a given electronic device 10, all or at least some of its bumps 13 (i.e., chip I/O pads) are aligned with all or at least some of the respective corrugated wiring areas 30 (i.e., substrate I/O pads). These bumps 13 and these corrugated wiring areas 30 are then respectively mechanically pressed together into good electrical contact. The electrical tests are then performed by testing circuitry (not shown) connected through the corrugated wiring areas 30 of the testing substrate 20 to the chip I/O pads. More particularly, voltages are delivered by the testing circuitry—via some of the wiring layers 22, of the corrugated wiring areas 30, and of the chip pads—to the electronic device 10; and the electrical responses of the device 10 are measured by the testing circuitry—via other of the chip pads, of the corrugated wiring areas, and of the wiring layers. Finally, the electronic device 10 is mechanically pulled away from the testing substrate 20, whereby the chip I/O pads are pulled away from the substrate I/O pads. Immediately thereafter, the testing substrate 20 is capable of likewise being used for similarly testing many other electronic devices, one after the other.

Although the invention has been described in detail in terms of a specific embodiment, various modifications can be made without departing from the scope of the invention. For example, instead of the vertices of adjacent V-grooves within a corrugated area 30 being spaced apart by approximately 16 μm in the X-direction, they can be spaced apart by distances in the approximate range of 1.0 to 20. μm—i.e., V-grooves having spatial periodicities in this range. Instead of V-grooves, other corrugation shapes (features) such as rectangles can be used, having spatial periodicities in this range. Moreover, it should be understood that if the testing circuitry (not shown) is ECL (emitter coupled logic) while the circuitry of the electronic device 10 is MOS (metal oxide semiconductor), an ECL-MOS translation device (not shown) can be connected between the device 10 and the testing circuitry, with a relatively small fan-out from the electronic device 10 to the translation device and a larger fan-out from the translation device to the testing circuitry.

Instead of the aluminum wiring layer 22 extending into the corrugated areas, more durable metals (such as Mo or W) can be deposited and patterned so as to be present in these corrugated areas, while the aluminum wiring layer is then deposited and patterned so as not to be present in the corrugated areas but to come into contact with the patterned durable metal. In this way, the presence of the underlying relatively soft aluminum will be avoided at areas where the solder bumps 13 will strike during the fast testing.

Also, as noted above, instead of phosphorus-containing nickel for the durable layer 23, ruthenium, titanium nitride, tantalum nitride platinum, or gold can be used.

Finally, the electronic device 10 can be a programmable device, such as an EPROM, and the substrate 20 can be a wiring substrate suitably designed with wiring layers 22 and with localized corrugated areas 30 that are aligned for temporary electrical access to the I/O pads of the programmable device. In this way, a plurality of such programmable devices can be programmed, one after the other, using only one and the same wiring substrate—by means of applying programming voltages through the wiring layers 22 and the corrugated areas 30 to the I/O pads of each of the programmable devices while the I/O pads of each of the programmable devices, one of the devices after another, are pressed against the corrugated areas of the substrate 20.

We claim:

1. A method of temporarily electrically connecting together a plurality of mutually spaced-apart I/O terminals of a first device to a plurality of mutually spaced-apart I/O pads of a second device, the terminals being located on a major planar surface of the first device, comprising the steps of (a) providing the second device having the I/O pads including the steps of
  providing a substrate initially having a planar top surface,
  wet etching into said top surface at each of a plurality of selected mutually spaced-apart portions thereof, each of which portion is located at areas defined by the I/O pads, the grooves having sufficiently small widths that a multiplicity of grooves are present within each of the areas, and
  forming a layer of substance overlying the top surface including the grooves, whereby an exposed top surface of each of the pads comprises the layer of substance having a corrugated exposed surface, the substance comprising either a metal whose oxide is electrically conducting or a non-oxidizable electrically conducting material;

(b) pressing together the terminals and the pads into electrical contact; and (c) nondestructively pulling apart the terminals from the pads, whereby both the first and second devices remain intact.

2. The method of claim 1 in which the corrugated surface has corrugation features that have a horizontal spatial periodicity in the approximate range of 1.0 μm and 20. μm.

3. A method in accordance with claim 1 for programming the first device, including the step, between the steps (b) and (c), of applying voltages through wiring layers located on the substrate and connected to the pads.

4. A method of according to claim 2 of programming a plurality of the first devices comprising the steps of performing steps (b) and (c) with each of a plurality of the first devices, one after the other.

5. A method of testing an electronic device, having a first set of first metallic I/O pads located on a major planar surface of the device, comprising the steps of:

(a) providing a testing substrate having a set of wiring layers respectively connected to second set of second metallic I/O pads including the steps of
  providing a body initially having a planar top surface,
  wet etching grooves into said top surface at each of selected portions thereof, each of which portion is located at areas defined by the second metallic I/O pads, the grooves having sufficiently small widths that a multiplicity of grooves are present within each of the areas, and
  forming a layer of substrate overlying the top surface including the grooves, whereby an exposed top surface of each of the pads comprises the layer of substance having a corrugated exposed surface, the substance comprising either a metal whose oxide is electrically conducting or a non-oxidizable electrically conducting material;

(b) pressing the first set of pads into electrical contact with the second set of pads;

(c) applying test voltages to at least some of the first set of pads through at least some of the second set of pads;

(d) measuring the electrical responses developed at other of the first set of pads through other of the second set of pads; and (e) nondestructively pulling apart the first set of pads from the second set of pads, whereby both the first and second devices remain intact.

6. A method according to claim 5 of testing a plurality of the first electronic devices further comprising the steps of:
  performing steps (b) through (e) with each of the plurality of the first electronic devices, one after the other.

7. The method of claim 6 in which the plurality is at least one hundred.

8. The method of claim 6 in which the plurality is at least one thousand.

9. The method of claim 5 in which the corrugated surface has corrugation features that have a horizontal spatial periodicity in the approximate range of 1.0 μm and 20. μm.

10. The method of claim 5 in which steps (b) through (e) span a duration of approximately ten seconds or less.

11. The method of claim 5 in which the substance comprises phosphorus-containing nickel.

12. The method of claim 5 in which the substance is essentially phosphorus-containing nickel.

13. The method of claim 5 in which the substance comprises ruthenium.

14. The method of claim 5 in which the substance is essentially ruthenium.

15. The method of claim 5 in which the substance comprises titanium nitride or tantalum nitride.

16. The method of claim 5 in which the substance is essentially titanium nitride or tantalum nitride.

17. The method of claim 5 in which the noble metal is essentially gold.

18. The method of claim 5 in which step (e) is performed within a lapse of time in the approximate range of one to ten seconds after step (b) has been performed.

19. The method of claim 18 in which the lapse of time is approximately one second.

20. The method of claim 1 in which the substrate comprises silicon having the top surface.

21. The method of claim 20 in which the step of etching grooves produces V-grooves in the top surface.

22. The method of claim 1 in which the step of etching grooves produces V-grooves in the top surface.

23. The method of claim 5 in which the body comprises silicon having the top surface.

24. The method of claim 23 in which the step of etching grooves produces V-grooves in the top surface.

25. The method of claim 1 in which the etching produces V-grooves in the top surface.

26. The method of claim 1, 20, 21, 22, or 25 in which the mutually space-apart I/O terminals of the first device comprise metallic bumps.

27. The method of claim 26 in which the metallic bumps comprise solder.

28. The method of 26 in which the metallic bumps comprise gold.

* * * * *